(12) United States Patent
Nogami et al.

(10) Patent No.: US 6,465,345 B1
(45) Date of Patent: *Oct. 15, 2002

(54) PREVENTION OF INTER-CHANNEL CURRENT LEAKAGE IN SEMICONDUCTORS

(75) Inventors: Takeshi Nogami, Atsugi (JP); Shekhar Pramanick, Fremont, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/321,643

(22) Filed: May 28, 1999

(51) Int. Cl.[7] .......................................... H01L 21/4763
(52) U.S. Cl. ....................... 438/631; 438/386; 438/637; 438/695; 257/303; 257/306
(58) Field of Search ................................ 438/631, 626, 438/634, 645, 697, 687, 688, 653, 654, 643, 644, 637, 622, 625, 627, 628, 629, 617, 638, 666, 668, 695, 907, 908, 909, 913, 386, 387, 685, 257, 397; 257/303, 306

(56) References Cited

U.S. PATENT DOCUMENTS

| | | | |
|---|---|---|---|
| 5,286,675 A | * 2/1994 | Chen et al. | 437/195 |
| 5,580,821 A | * 12/1996 | Mathews et al. | 437/187 |
| 5,643,819 A | * 7/1997 | Tseng | 437/60 |
| 5,830,805 A | * 11/1998 | Shacham-Diamand et al. | 438/678 |
| 5,976,945 A | * 11/1999 | Chi et al. | 438/386 |
| 6,001,726 A | * 12/1999 | Nagabushnam et al. | 438/618 |
| 6,054,378 A | * 4/2000 | Skala et al. | 438/620 |
| 6,136,649 A | * 10/2000 | Hui et al. | 438/257 |
| 6,165,894 A | * 12/2000 | Pramanick et al. | 438/627 |
| 6,218,255 B1 | * 4/2001 | Fritzinger et al. | 438/386 |
| 6,248,660 B1 | * 6/2001 | Hamanaka et al. | 438/629 |

FOREIGN PATENT DOCUMENTS

JP    10-214834    * 8/1998

OTHER PUBLICATIONS

Wolf and Tauber; Silicon Processing for the VLSI Era vol. 1: Process Technology pp. 161, 191–195; Lattice Press, NY; ® 1986.*

Wolf, Stanley and Tauber Richard; Silicon Processing for the VLSI Era, vol. 1; copyright 1986 Lattice Press, Sunset Beach, California; pp. 171–174 and 542–551.*

* cited by examiner

*Primary Examiner*—Wael Fahmy
*Assistant Examiner*—Fernando Toledo
(74) *Attorney, Agent, or Firm*—Mikio Ishimaru

(57) ABSTRACT

A method for eliminating copper atomic residue from the channel oxide layer on semiconductors after chemical-mechanical polishing is provided. After chemical-mechanical polishing, the silicon oxide is plasma etched to remove its surface and any residue. After plasma etching, an etch stop layer of silicon nitride is deposited by chemical-vapor deposition. Both the plasma etch of the silicon dioxide and the chemical-vapor deposition of the silicon nitride can be performed in the same vacuum chamber in the same semiconductor processing tool with only a change of the gas mixture.

9 Claims, 2 Drawing Sheets

PREVENTION OF INTER-CHANNEL CURRENT LEAKAGE IN SEMICONDUCTORS

TECHNICAL FIELD

The present invention relates generally to semiconductor manufacturing and more a method for preventing inter-channel current leakage.

BACKGROUND ART

While manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique, starts with the placement of a patterned etch stop layer, which is typically a silicon nitride "nitride" layer, over the semiconductor devices followed by a first channel dielectric layer, which is typically a silicon dioxide, "oxide" layer. A first damascene step photoresist is then placed over the oxide layer and is photolithographically processed to form the pattern of the first channels. An anisotropic dielectric etch is then used to etch out the channel dielectric layer to form the first channel openings in contrast with the semiconductor devices. The damascene step photoresist is stripped and an optional thin adhesion layer is deposited to coat the walls of the first channel openings to ensure good adhesion and electrical contact of subsequent layers to the underlying semiconductor devices. A barrier layer is then deposited on the adhesion layer to improve the formation of subsequently deposited conductive material and to act as a barrier material to prevent diffusion of such conductive material into the oxide layer and the semiconductor devices (the combination of the adhesion and barrier material is collectively referred to as "barrier layer herein). It should be noted that some barrier materials also have good adhesion which is why the adhesion layer is optional. A "seed" layer is then deposited to act as a seed for additional conductive material to be deposited. A first conductive material is then deposited and subjected to a chemical-mechanical polishing process which removes the first conductive material above the first channel dielectric layer and damascenes the first conductive material in the first channel openings to form the first channels.

Often, there are atoms of the barrier, seed, and conductive material left on the first channel dielectric layer after the chemical-mechanical polishing. These atoms present a problem because they offer a current path to allow leakage of electrical current between the various first channels. This adversely affects the performance of the entire integrated circuit.

For multiple layers of channels, another metalization process, which is called the "dual damascene" technique, is used in which the channels and vias are formed at the same time. In one example, the via formation step of the dual damascene process starts with the deposition of a thin patterned etch stop layer, which is generally a nitride, over the first channels and the first channel dielectric layer.

Subsequently, a separating oxide layer is deposited on the etch stop. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel dielectric layer and is photolithographically processed to form the pattern of the second channels. An anisotropic oxide etch is then used to etch the second channel dielectric layer to form the second channel openings and, during the same etching process to etch the via areas down to the thin etch stop layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and the via openings to form the second channel and the via. A second chemical mechanical polishing process leaves the two vertically separated, horizontally perpendicular channels connected by a cylindrical via.

For two layers of channels, various types of capping layers are deposited with patterning for bonding pads which would be used to connect to external electrical connections. Where there are additional layers of metalization, the dual damascene process would be repeated to produce the desired number of channels.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One of the problems of using copper is that it diffuses rapidly through various materials. This means that the copper atoms which may be left after chemical-mechanical polishing will diffuse and create leakage paths for current between the various channels in each level.

A solution, which would simply eliminate contamination of dielectric layers after chemical-mechanical polishing, has been long sought. As the semiconductor industry is moving from aluminum to copper and other types of high conductivity materials in order to obtain higher semiconductor circuit speeds, it is becoming more pressing that a solution be found.

DISCLOSURE OF THE INVENTION

The present invention provides a method for removing the atomic residue of conductive materials left on the channel dielectric layers of semiconductors after planarization. After planarization and removal of such atomic residue, an etch stop layer is deposited on the channel dielectric which eliminates the leakage of current between the conductive channels.

The present invention further provides a method for removing the atomic residue of copper from the silicon dioxide dielectric layer of a semiconductor after chemical-mechanical polishing. After chemical-mechanical polishing and removal of the atomic residue of copper, the silicon nitride layer is deposited onto the silicon dioxide to eliminate leakage current through the silicon nitride/silicon oxide interface.

The present invention further provides a method for using a chemical-vapor deposition system for plasma etching by changing the gas mixture in the system's vacuum chamber.

The present invention further provides a method for using a silicon nitride chemicalvapor deposition system for plasma etching a silicon dioxide layer.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
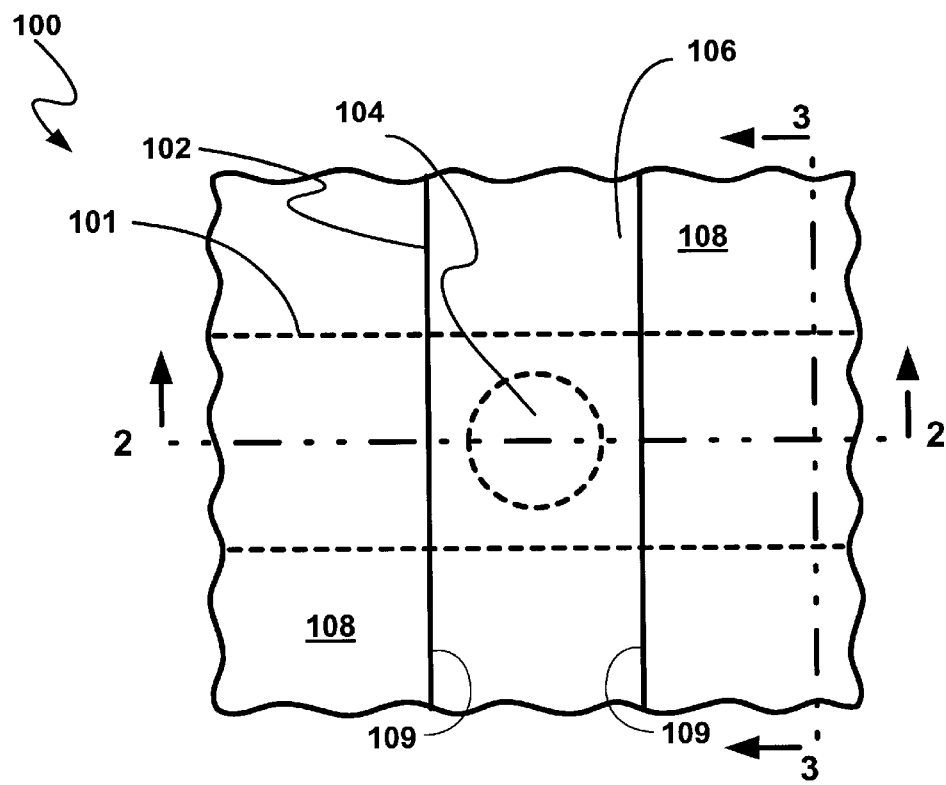
FIG. 1 (PRIOR ART) is a plan view of aligned channels with a prior art via.

Referring now to FIG. 1 (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel 101 contains a conductive material. The second channel 102 is formed by filling a second channel opening 106 disposed in a second channel dielectric layer 108 with the conductive material. The dielectric layers are generally of silicon dioxide (SiO$_2$), and the conductive material is generally copper or a copper alloy. More recent copper technologies are likely to be combined with some low-k (low dielectric constant) materials such as TEOS (tetraethoxysilane), TMOS (tetramethoxysilane), OMCTS (octamethyleyclotetrasiloxane), HMDS (hexamethyldisiloxane), SOB (trimethylsilil borxle), DADBS (diaceloxyditerliarybutoxsilane), SOP (trimethylsilil phosphate), HSQ (hydrogen silsesquioxane), and BCB (benzocyclobutene).

The second channel opening 106 is defined by walls (sidewalls) 109 of the second channel dielectric 108.

Figure 2:
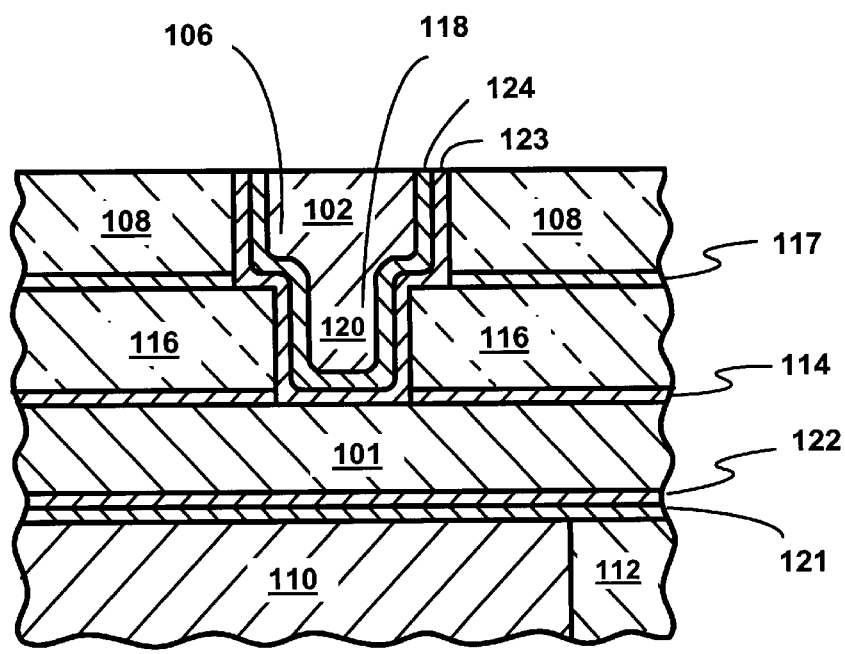
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. The first channel 101 is disposed over a polysilicon gate 110 and a dielectric 112 of a semiconductor device on an integrated circuit chip (not shown). The first and second channels 101 and 102 are in horizontal planes separated vertically by an etch stop layer 114, a via dielectric layer 116, and a thin via etch stop layer 117. The conventional etch stop layer is composed of a compound of silicon nitride (SiN). The cross-sectional area of the round via 104 of FIG. 1 (PRIOR ART) defines a cylindrical via 120 when it is filled with the second conductive material. Also shown disposed around the first channel 101 is a barrier layer 121, a seed layer 122 and around the second channel 102 and the cylindrical via 120 is a barrier layer 123 and a seed layer 124.

Figure 3:
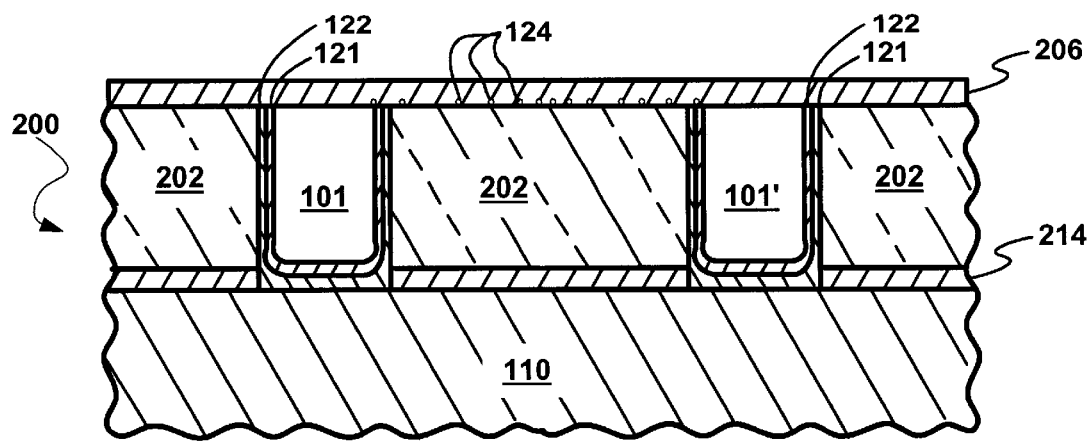
FIG. 3 (PRIOR ART) is a cross-section of FIG. 1 (PRIOR ART) along line 2—2 partially through the semiconductor manufacturing process.

Referring now to FIG. 3 (PRIOR ART), therein is shown the cross-section of a semiconductor wafer 200 in a preliminary stage of manufacture. Strictly for ease of understanding, the completed semiconductor wafer 200 can be understood to be the equivalent of the semiconductor wafer 100 taken along the line 3—3 showing two parallel first conductive channels 101 and 101'. The cross-section of FIG. 3 shows the cross-section of semiconductor wafer 200 with the same numbers as shown in FIG. 2 for the same parts.

FIG. 3 (PRIOR ART) shows the semiconductor wafer 200 after the deposition of an etch stop layer 214 and the barrier layer 121, the seed layer 122, and the first channel 101. The barrier layer 121 would be formed of barrier materials such as tantalum (Ta)/tantalum nitride (TaN), titanium (Ti)/ titanium nitride (TiN), tungsten (W)/ tungsten nitride (WN), and the first channel 101 would be formed of copper or a copper alloy. The surface of the first channel 101, the barrier layer 121, and the seed layer 122 have been subject to chemical-mechanical polishing (CMP) to be level with the first channel dielectric layer 202.

Conductive material atoms 124 are shown on the first channel dielectric layer 202. These atoms 124 are the result of the CMP, which uses a pad and abrasive, to polish a conductive material of the barrier, seed, and first channel down to the first channel dielectric layer 202. This leaves diffusible and conductive materials all over the first channel dielectric layer 202, and most particularly between conductive channels 101 and 101'. This occurs both for silicon oxide dielectrics as well as for low K dielectrics. This leads to unpredictable current leakage between the conductive channels 101 and 101'. An etch stop layer 206 is shown deposited over the first channel 101, the seed layer 122, the barrier layer 121, and the first channel dielectric layer 202.

Figure 4:
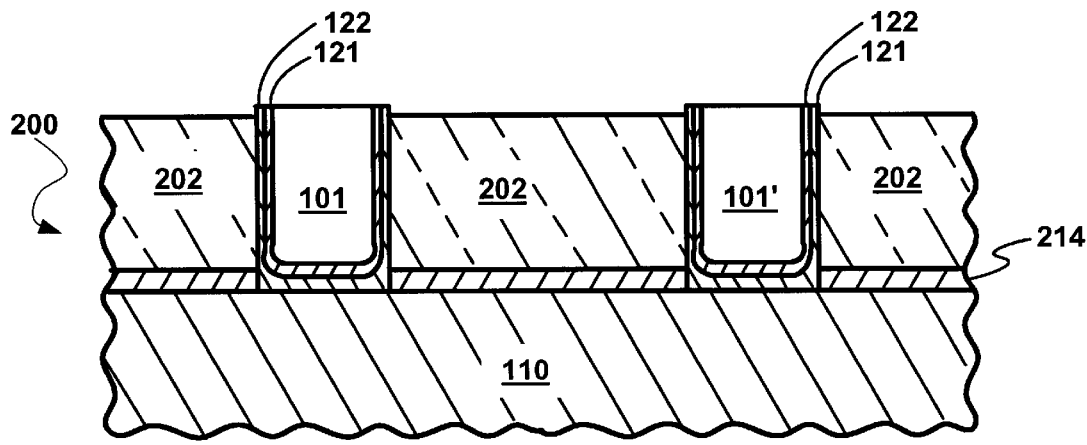
FIG. 4 is a cross-section similar to FIG. 3 (PRIOR ART) after removal of the top surface of the dielectric layer.

Referring now to FIG. 4, therein is shown a cross-section similar to that shown in FIG. 3 (PRIOR ART) after CMP and after removal of a small portion of the top surface of the first channel dielectric layer 202 by a plasma etching process. In plasma etching, a small amount of reactive gas is fed into a vacuum chamber in which the silicon wafer 200 is placed. An electromagnetic field is then applied to etch away enough of the dielectric, or silicon dioxide, surface that the conductive material atoms 124 are removed from the dielectric surface.

The stop etch layer 208 of silicon nitride is deposited by chemical-vapor deposition in which the stop etch layer is formed on the heated semiconductor wafer by the thermal reaction of gaseous compounds. For silicon nitride layer, the gases are generally silane and ammoma.

Figure 5:
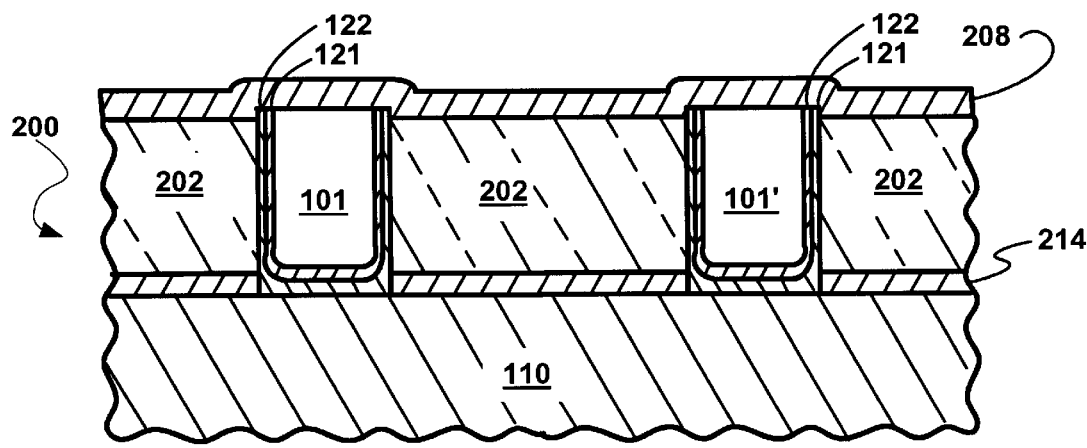
FIG. 5 is FIG. 4 after deposition of the etch stop layer.

Referring now to FIG. 5, therein is shown FIG. 4 after deposition of the etch stop layer 208. Due to the plasma etching steps, there are no atoms 124 to provide leakage paths between the first channel dielectric layer 202 and the etch stop layer 208.

In production in the past, a conventional first damascene process was used to put down a first channels 101 and 101' in a first channel dielectric layer 202 over an etch stop layer 214 on a production semiconductor wafer 200. The damascene process is a photolithographic process which uses a mask to define a first channel opening (not shown) in the first channel dielectric layer. The first channel opening is then filled with the thin barrier layer 121, the thin seed layer 122, and the first conductive material, such as copper, to form the first channels 101 and 101' using conventional metal deposition techniques, such as physical vapor deposition, chemical-vapor deposition, electroplating, or a combination thereof. The top surface would then be subject to CMP.

For the second channel 102, the etch stop layer 114, the via dielectric layer 116, and the via etch stop layer 117 would be successively deposited on top of the first channels 101 and 101' and the first channel dielectric layer 202 using conventional deposition techniques.

By using the via photoresist and the via photolithographic process followed by etching of a round via opening 104 in the via etch stop layer 117, the basis for the cylindrical via 118 was formed. The subsequent deposition of the second channel dielectric layer 108 prepared the way for the second channel 102 to be perpendicular to the first channels 101 and 101'.

The second damascene process is a photolithographic process which uses a mask to define the second channel opening 106 in the second channel dielectric layer 108. Since the second damascene process uses an anisotropic dielectric etch, the etch also forms the cylindrical via opening 118 down to the etch stop layer 114. The anisotropic dielectric etch etches faster in the vertical direction of FIG. 3 than in the horizontal direction. The etch of the etch stop layer 114 exposes a portion of the first channel 101 and completes the etching steps. The second channel opening 106 is then filled with the thin barrier layer 123, the thin seed layer 124, and the second conductive material. The second conductive material is also a conductor, such as copper, to form the second channel 102 using conventional metal deposition techniques, such as physical vapor deposition, chemical-vapor deposition, electroplating, or a combination thereof. A CMP process is used to level the second channel 102 to form the structure shown in FIG. 2.

In production with the present invention, said steps are the same through the first damascene process of using CMP to remove the first conductive material down to the first channel dielectric layer 202. After CMP, the semiconductor wafer 200 would be placed in the reaction chamber of a chemical-vapor deposition system and pumped down to a vacuum. A reactive gas such as fluorine or chlorine, would be added to the vacuum chamber and an electromagnetic field applied to cause the system to act as a plasma etcher to remove the top surface of the first channel dielectric layer 202 and any contamination on the surface thereof. After completion of the plasma etching, the system would be made to operate as a conventional chemical-vapor deposition system for deposition of the etch stop layer 208 by changing the gas mixture to one of silane and ammonia, and heating the semiconductor wafer 200. Essentially, this would allow one system, or processing tool, to act to both remove the silicon dioxide of the dielectric and deposit the stop etch layer 208 of silicon nitride.

With the etch stop layer 208 in place, the dual damascene process is performed. Subsequently, the dual damascene semiconductor wafer processing with plasma etching and chemical vapor deposition can be repeated for additional levels of channels.

While the best mode utilizes copper as the conductive material, it should be understood that the present invention is applicable to conductive materials such as copper, aluminum, doped polysilicon, gold, silver, compounds thereof, alloys thereof, and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A method of manufacturing a semiconductor device, comprising:
    providing a semiconductor with a dielectric layer formed thereon;
    forming an opening in said dielectric layer, said opening defined by walls of said dielectric layer;
    forming a conductive layer with a first portion over said dielectric layer and a second portion in said opening;
    removing said first portion of the conductive layer by a process which leaves a residual portion of said first portion of the conductive layer on said dielectic layer;
    removing a portion of said dielebtric layer to remove said residual portion of said first portion of the conductive layer; and
    forming a stop layer over said second portion of the conductive layer and said dielectric layer.

2. The method for manufacturing a semiconductor device as claimed in claim 1 wherein removing said portion of said dielectric layer uses plasma etching.

3. The method for manufacturing a semiconductor device as claimed in claim 2 wherein forming said s top layer uses a chemical-vapor deposition.

4. The method for manufacturing a semiconductor device as claimed in claim 3 wherein forming said conductive layer uses a material selected from a group consisting of copper, aluminum, doped polysilicon, gold, silver, an alloy thereof, and a compound thereof.

5. The method for manufacturing a semiconductor device as claimed in claim 2 wherein removing said portion of said dielectric layer and forming said stop layer use the same semiconductor processing system.

6. A method of manufacturing a semiconductor device, comprising:
    providing a semiconductor wafer with a silicon oxide layer formed thereon;
    forming an opening in said silicon oxide layer. said opening defined by walls of said silicon oxide layer,
    depositing a first barrier layer on said semiconductor wafer and in said opening to line said silicon oxide layer, said first barrier layer is selected from a group consisting of tantalum, titanium, tungsten an alloy thereof, and a compound thereof;
    depositing a conductive layer with a first portion over said first barrier layer on said semiconductor wafer and a second portion in said opening, said conductive layer filling said opening and selected from a group consisting of copper, aluminum, doped polysilicon, gold, silver, an alloy thereof, and a compound thereof;
    removing said first portion of the conductive layer and said barrier layer on said semiconductor wafer by a process which leaves a residual portion of said first portion of the conductive layer on said dielectric layer;

removing a portion of said dielectric layer to remove said residual portion of said first portion of the conductive layer; and depositing a stop layer over said semiconductor wafer and said second portion of the conductive layer, said stop layer is of silicon nitride.

7. The method for manufacturing a semiconductor device as claimed in claim 6 wherein removing said portion of said silicon oxide layer uses plasma etching.

8. The method for manufacturing a semiconductor device as claimed in claim 7 wherein forming said stop layer uses chemical-vapor deposition.

9. The method for manufacturing a semiconductor device as claimed in claim 8 wherein removing said portion of said silicon oxide layer and depositing said silicon nitride use the same vacuum chamber in a semiconductor processing system.

\* \* \* \* \*